(12) United States Patent
Xu et al.

(10) Patent No.: US 6,809,619 B1
(45) Date of Patent: Oct. 26, 2004

(54) SYSTEM AND METHOD FOR ADJUSTING MAGNETIC CENTER FIELD FOR PERMANENT MRI MAGNETIC FIELD GENERATOR

(75) Inventors: Bu-Xin Xu, Florence, SC (US); Weijun Shen, Florence, SC (US)

(73) Assignee: G.E. Medical Systems Global Technology Co., LLC, Waukesha, WI (US)

( * ) Notice: Subject to any disclaimer, the term of this patent is extended or adjusted under 35 U.S.C. 154(b) by 0 days.

(21) Appl. No.: 10/686,972

(22) Filed: Oct. 16, 2003

(51) Int. Cl.[7] ............................................... G01V 3/00
(52) U.S. Cl. ...................... 335/296; 335/298; 335/301; 324/320
(58) Field of Search ......................... 335/216, 296–306; 324/318–320

(56) References Cited

U.S. PATENT DOCUMENTS 4,943,774 A * 7/1990 Breneman et al. .......... 324/318
6,437,672 B1 * 8/2002 Takeshima et al. ......... 335/216

* cited by examiner

Primary Examiner—Ramon M. Barrera
(74) Attorney, Agent, or Firm—McAndrews, Held & Malloy, Ltd.

(57) ABSTRACT

The present invention relates to a method and system for adjusting a magnetic center field of a magnetic field generator in an MRI. One embodiment of the presenting invention relates to a magnetic field generator system having a magnetic center field. This embodiment comprises opposing posts and opposing yokes connected to the opposing posts, where at least one of the posts has a spacer. At least one permanent magnetic block is connected to at least one of the opposing yokes. Further, at least one spacer is formed in at least one of the posts, the yokes and/or the permanent magnetic block.

17 Claims, 8 Drawing Sheets

SYSTEM AND METHOD FOR ADJUSTING MAGNETIC CENTER FIELD FOR PERMANENT MRI MAGNETIC FIELD GENERATOR

BACKGROUND OF THE INVENTION

Embodiments of the present invention relate generally to a permanent MRI magnetic field generator. More specifically, embodiments of the present invention relate to an apparatus and method for adjusting a magnetic center field of a permanent MRI magnetic field generator.

It should be appreciated that a highly uniform magnetic center field is generally preferable for magnetic resonance imaging (alternatively referred to as "MRI") used as a medical device. Currently available (low maintenance) MRI systems include a permanent magnetic field generator that creates middle range uniform field (0.2 to 0.5 Tesla) in pre-determined space (alternatively referred to as "imaging volume"). Known permanent magnetic field generator usually use multiple small sized permanent magnet blocks (NdFeB for example) together with other iron parts to form a single magnetic object or polepiece and to achieve the desired magnetic center field with high uniformity in the imaging volume.

It should be appreciated that the accuracy of the magnetic center field is one of the critical parameters for magnets used in an MRI system or device, and thus to the imaging quality of the MRI device as a whole. Furthermore, it is known that, for a particular magnet used in an MRI system or device, the magnetic center field must be stable, normally staying within a small range (i.e., having a very small tolerance) to produce good quality images, where such variance may be due to such factors as the adjustability of radio frequency (alternatively referred to as "RF") coils. For example, in a 0.35 Tesla MRI system, the magnetic center field should normally stay within the range of 0.3495 to 0.3510 Tesla in order for the system to produce good quality medical images.

It should be appreciated that assembling one or more magnetic members together to form a magnet used in an MRI system having a targeted magnetic center field is very difficult. That is due to the magnetic center field varies due to a number of factors, including, without limitation, material physical tolerance, variation of material physical properties, magnetic interaction forces, assembly tolerances, process variations, etc. It is known that after assembly of the MRI system, the magnetic center field of the MRI deviates off the mean. Frequently, the magnetic fields of the MRI system must be adjusted in order to achieve the desired magnetic center field.

Providing an MRI system that enables adjusting the permanent magnets after assembly, enables more permanent magnetic blocks to be installed in MRI systems, as enabling adjusting the permanent magnets after installation enables the magnetic center field to be raised or otherwise adjusted if the magnetic center field is determined to be below a desired design value.

It is known to add one or more permanent blocks in order to obtain a desired magnetic center field. However, it is much more difficult (and sometimes is impossible) to extract installed magnetized blocks as the magnetized blocks are often either glued to the neighboring parts or clamped to the yoke after insertion to fix the blocks thereto due to large repelling magnetic force between magnetic parts.

Furthermore, installing more permanent blocks, enables adjusting the magnetic center field discretely as desired, and not just as fraction of the permanent magnetic block. For example, if system requires a 70 Gauss increase, however, each permanent magnetic block increases the magnetic field by 45 Gauss. In this situation, adding one block set or two sets will not achieve desired center magnetic field.

BRIEF SUMMARY OF THE INVENTION

Embodiments of the present invention relate to a magnetic field generator for an MRI. More specifically, embodiments of the present invention relate to a method for adjusting of center magnetic field, magnetic field generator for MRI incorporating permanent magnets. At least one embodiment of this invention relates to an approach to adjust magnetic field in the imaging volume used for MRI magnetic field generator using a mechanical design.

One embodiment of the presenting invention relates to a magnetic field generator system having a magnetic center field. This embodiment comprises opposing posts and opposing yokes connected to the opposing posts, where at least one of the posts has a spacer. At least one permanent magnetic block is connected to at least one of the opposing yokes. Further, at least one spacer is formed in at least one of the posts, the yokes and/or the permanent magnetic block.

In one or more embodiments of the present invention, the at least one spacer comprises at least one slot formed in at least one of the opposing yokes. The at least one spacer may further comprise at least one slot formed in opposing ends of at least one of the opposing slots and at least one slot formed in each of the opposing yokes. It is further contemplated that the spacer may comprise a plurality of slots formed in at least one of the opposing yokes in a symmetrical or un-symmetrical pattern. It is further contemplated that at least two of the plurality of slots are of different sizes and/or shapes.

In at least one embodiment, the at least one spacer comprises at least one plate, a steel plate for example, adapted to be inserted at least part way in at least one of the one slots. It is contemplated that the spacer comprises a plurality of plates, wherein at least two of the plates are comprised of differential. It is also contemplated that the at least one plate is composed of the same or different material than the opposing yokes.

One embodiment of the present invention comprises a method for adjusting a magnetic center field of a permanent magnet system. In at least this embodiment, the method comprises determining if an adjustment required for the magnetic center field and adjusting the magnetic center field by using at least one spacer in the permanent magnet system.

One or more embodiments of the method comprises adjusting the magnetic center field using the at least one spacer comprises forming at least one slot in at least one of two opposing yokes. Adjusting the magnetic center field may further comprise forming at least one slot in opposing ends of at least one of the opposing slots and at forming at least one slot formed in each of the opposing yokes. It is further contemplated that adjusting the center field may comprise forming a plurality of slots formed in at least one of the opposing yokes in a symmetrical or un-symmetrical pattern. It is further contemplated that adjusting the center field comprises forming a plurality of slots, wherein at least two slots of the plurality of slots are of different sizes and/or shapes.

In at least one embodiment, adjusting the magnetic center field using at least one spacer comprises inserting at least one plate, a steel plate for example, at least partway into at least one of the slots. In one embodiment, the steel plate is completely inserted into the slot. It is further contemplated that adjusting the magnetic field using at least one spacer comprises inserting a plurality of plates, at least partway in one or more of the slots, wherein at least two of the plates are comprised of the same or different material. It is also contemplated that the at least one plate is composed of the same or different material than the opposing yokes. If a plurality of plates are use, one or more plates may-be inserted partway into a slot, while one or more plates may be completely inserted into the slots. It is further contemplated that adjusting the center field comprises a plurality of plates, where at least two plates of the plurality of plates are different sizes and/or shapes.

Still another embodiment of the present invention comprises a method for adjusting a magnetic center field of a permanent magnet system in an MRI device. In this embodiment, the method comprises determining an adjustment required for the magnetic center field and adjusting the magnetic center field using at least one spacer in the permanent magnet system. In this embodiment, the method further comprises determining if the adjustment is sufficient.

One or more embodiments of the method comprises adjusting the magnetic center field using the at least one spacer comprises forming at least one slot in at least one of two opposing yokes. Adjusting the magnetic center field may further comprise forming at least one slot in opposing ends of at least one of the opposing slots and at forming at least one slot formed in each of the opposing yokes. It is further contemplated that adjusting the center field may comprise forming a plurality of slots formed in at least one of the opposing yokes in a symmetrical or un-symmetrical pattern. It is further contemplated that adjusting the center field comprises forming at least two of the plurality of slots are of different sizes and/or shapes.

In at least one embodiment, adjusting the magnetic center field using at least one spacer comprises inserting at least one plate, a steel plate for example, at least partway into at least one of the slots. It is further contemplated that adjusting the magnetic field using at least one spacer comprises inserting a plurality of plates, at least partway in one or more of the slots, wherein at least two of the plates are comprised of the same or different material. It is also contemplated that the at least one plate is composed of the same or different material than the opposing yokes.

The foregoing summary, as well as the following detailed description of certain embodiments of the present invention, will be better understood when read in conjunction with the appended drawings. It should be understood, however, that the present invention is not limited to the arrangements and instrumentality shown in the attached drawings.

DETAILED DESCRIPTION OF THE INVENTION

Embodiments of the present invention relate to a magnetic field generator for an MRI. More specifically, embodiments of the present invention relate to a system and method for adjusting of center magnetic field, magnetic field generator for MRI incorporating permanent magnets. At least one embodiment relates to adjusting a magnetic center field in the imaging volume used for MRI magnetic field generator using a mechanical design.

Figure 1:
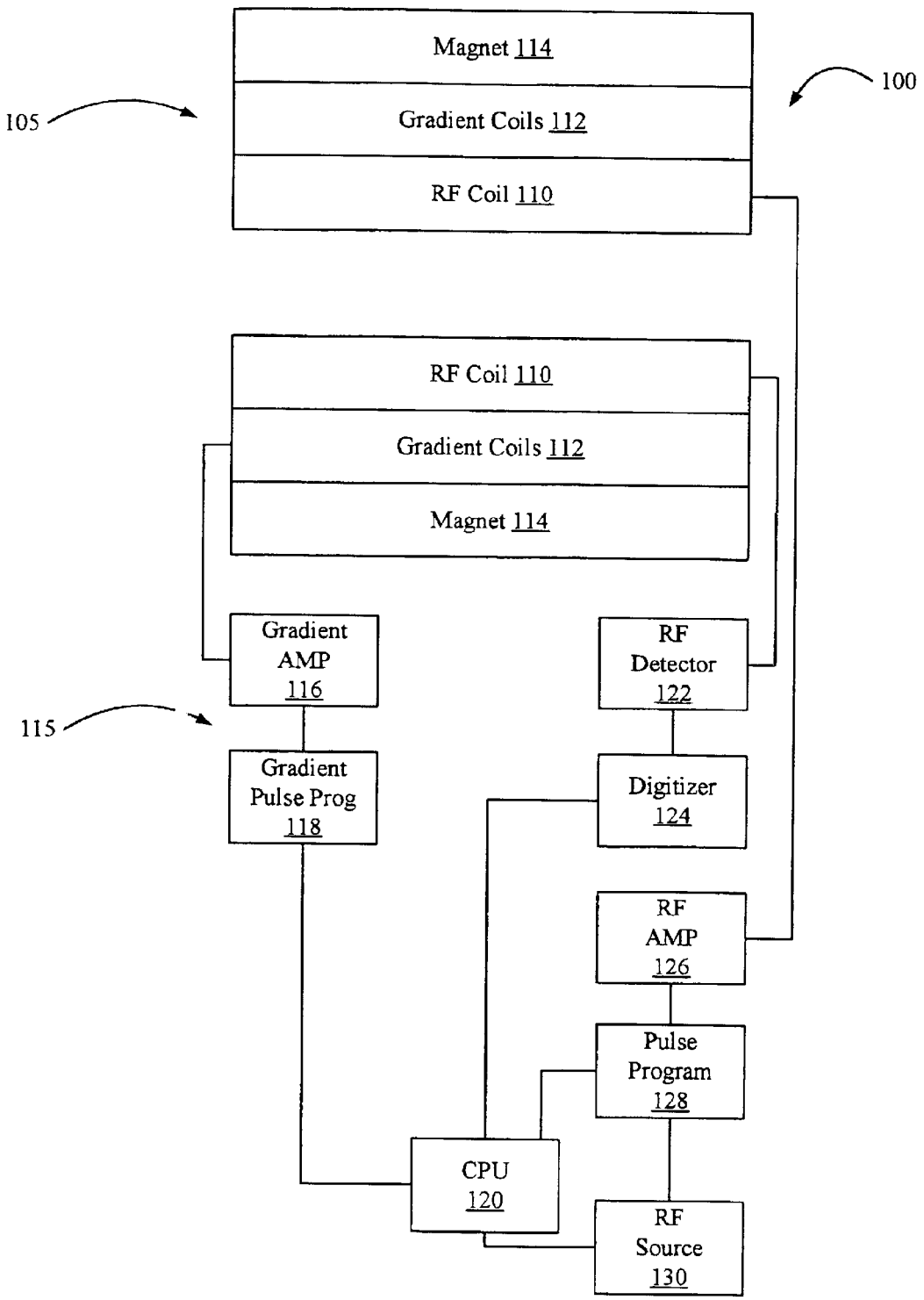
FIG. 1 illustrates a block diagram of a permanent MRI magnetic field generator in accordance with various embodiments of the present invention.

FIG. 1 illustrates a schematic representation of some of the major components of a magnetic resonance imager or MRI, generally designated 100, and a few of the major interconnections. The components illustrated at the top of FIG. 1 comprise the imager, generally designated 105, which may be located in the scan room. Magnet 114 produces the $B_o$ field for the imaging procedure. In at least one embodiment, within magnet 114 gradient coils 112 are included for producing a gradient in $B_o$ field in the X, Y, and Z directions. In this embodiment, the RF coil 110 is within the gradient coils 112. The RF coil 110 produces the $B_1$ magnetic field necessary to rotate the spins by 90° or 180°. The RF coil 110 may also detect the signal from the spins within the body.

In at least one embodiment, the patient is positioned within the magnet 114. Preferably, the scan room is surrounded by an RF shield that prevents the high power RF pulses from radiating out through the surrounding environment. The RF shield may also prevent extraneous RF signals from television and radio stations, for example, from entering the scan room and being detected by the imager 115. Some scan rooms may also be surrounded by a magnetic shield which confines the magnetic field.

In at least one embodiment, the imager 115 includes a computer or CPU 120, where CPU 120 controls all components of the imager 115. The RF components under the CPU's control include the radio frequency source and pulse programmer 130 and 128, respectively. Source 130 produces a sine wave of the desired frequency. Pulse programmer 128 shapes the RF pulses into apodized sinc pulses. RF amplifier 126 increases the pulses power from milliWatts to killoWatts. CPU 120 also controls the gradient pulse programmer 118, which sets the shape and amplitude of each of the three gradient fields. The gradient amplifier 116 increases the power of the gradient pulses to a level sufficient to drive the gradient coils.

In at least one embodiment, a keyboard, mouse or other control device provides input to the CPU 120. An image sequence is selected and customized from the console. The images may be displayed on a display device, stored or copied to film.

It should be appreciated that magnet 114 is the most expensive component of the magnetic resonance imaging system. In the embodiments described here. (Note: What we describe in this application is permanent magnet, not superconducting magnet).

Gradient coils 112 produce the gradients in the $B_o$ magnetic field as provided previously. The gradient coils are coils kept at room temperature, that, because of their configuration, create the desired gradient. The gradient coils are described with respect to the patient gap between up and bottom poles.

Assuming the standard magnetic resonance coordinate system, a gradient in $B_o$ in the Z direction may be created using an antihelmholtz type of coil. Current in the two coils flow in opposite directions, creating a magnetic field gradient between the two coils. The B field at one coil adds to the $B_o$ field while the B field at the center of the other coil subtracts from the $B_o$ field.

Figure 8:
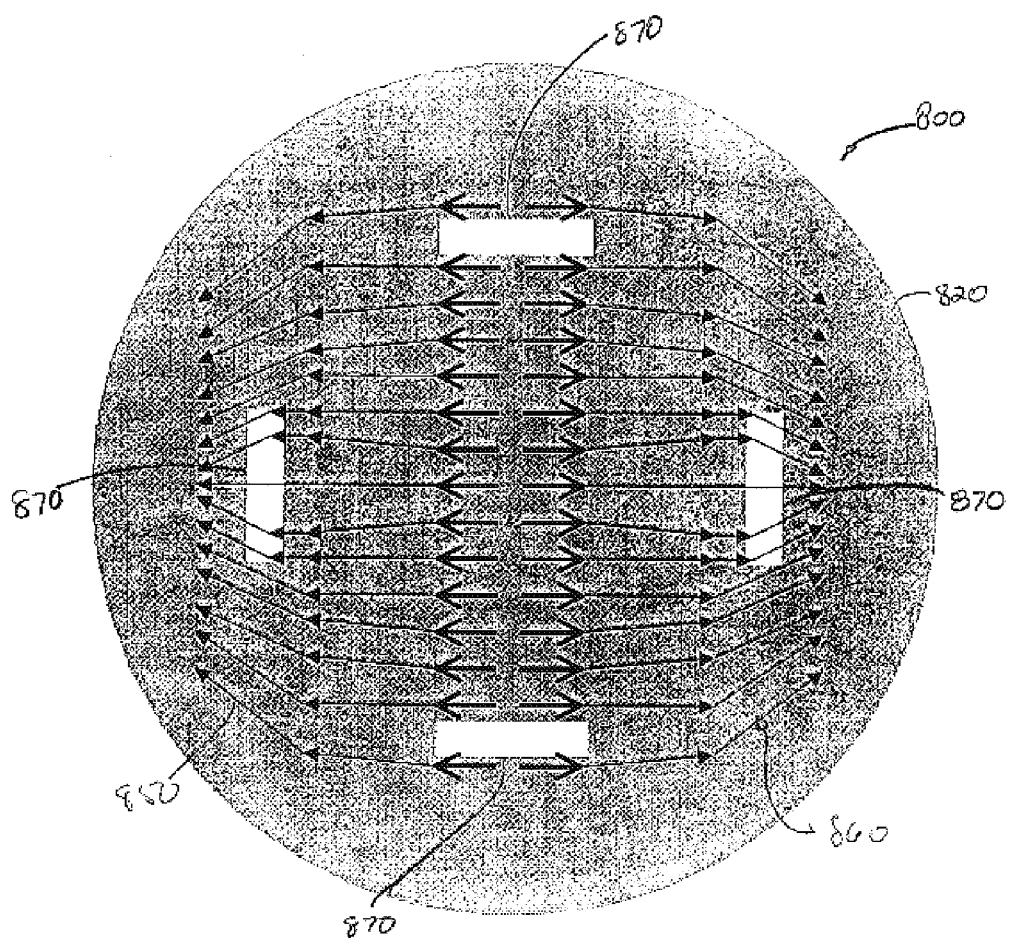
FIG. 8 depicts a top plan view of a permanent magnet with slots cut or formed in the yoke similar to that illustrated in FIG. 7 and depicting magnetic flux paths in accordance with various embodiments of the present invention.

The X and Y gradients in the $B_o$ field may be created by a pair of figure-8 coils. The X axis figure-8 coils creates a gradient in $B_o$ in the X direction due to the direction of the current through the coils. The Y axis figure-8 coils provides a similar gradient in $B_o$ along the Y axis.

RF coils 110 create the $B_1$ field which rotates the net magnetization in a pulse sequence. RF coils 100 also detect the transverse magnetization as it processes in the XY plane. In general, RF coils may be divided into three categories; 1) transmit and receive coils, 2) receive only coils, and 3) transmit only coils. Transmit and receive coils serve as the transmitter of the $B_1$ fields and receiver of RF energy from the imaged object. A transmit only coil is used to create the $B_1$ field and a receive only coil is used in conjunction with the transmit only coil to detect or receive the signal from the spins in the imaged object. There are several varieties of each.

Embodiments of the present invention relate to a magnetic field generator for an MRI. More specifically, embodiments of the present invention relate to a method for adjusting of center magnetic field, magnetic field generator for MRI incorporating permanent magnets. At least one embodiment of this invention relates to an approach to adjust magnetic field in the imaging volume used for MRI magnetic field generator using a mechanical design.

Figure 2:
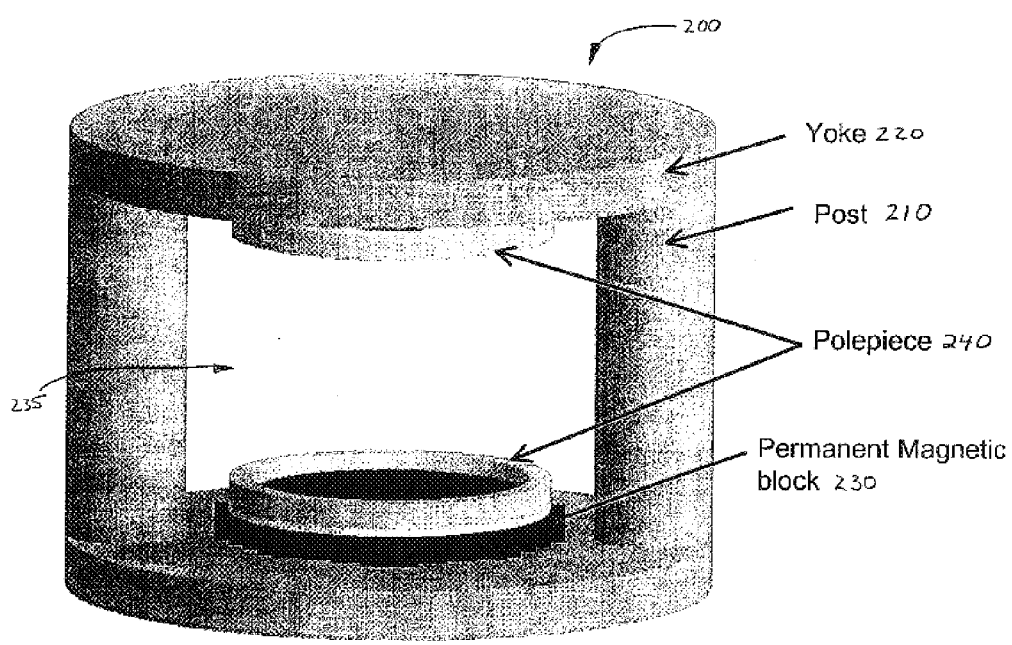
FIG. 2 illustrates a perspective view of a known permanent magnet.
Figure 3:
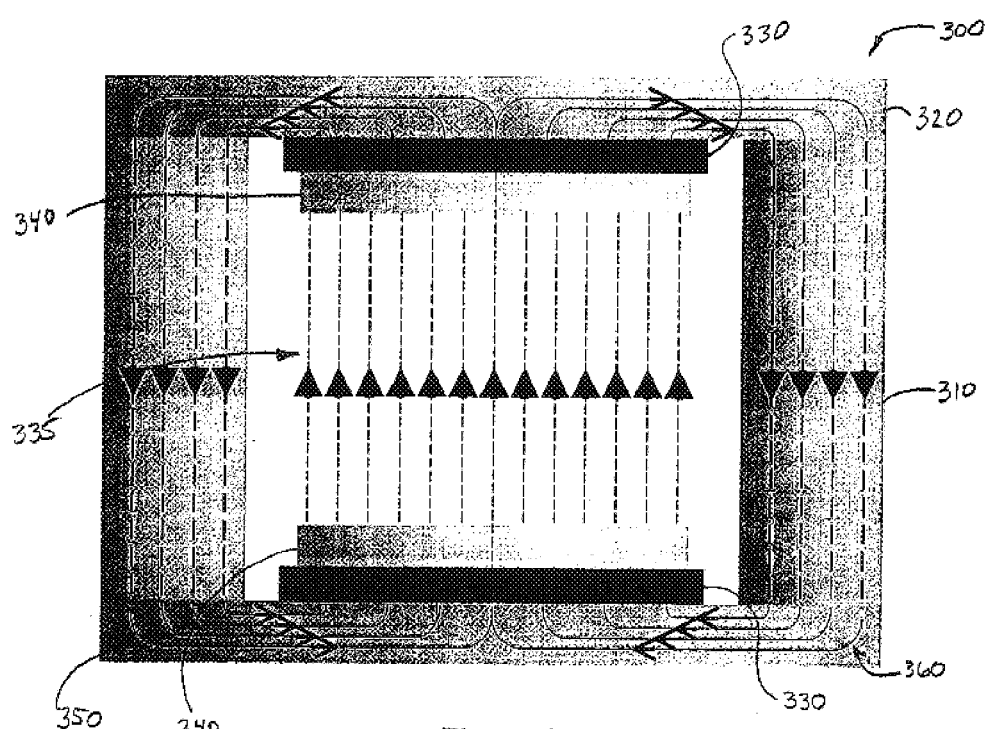
FIG. 3 illustrates a side elevational view of a known permanent magnet similar to that illustrated in FIG. 2 depicting magnetic flux paths.
Figure 4:
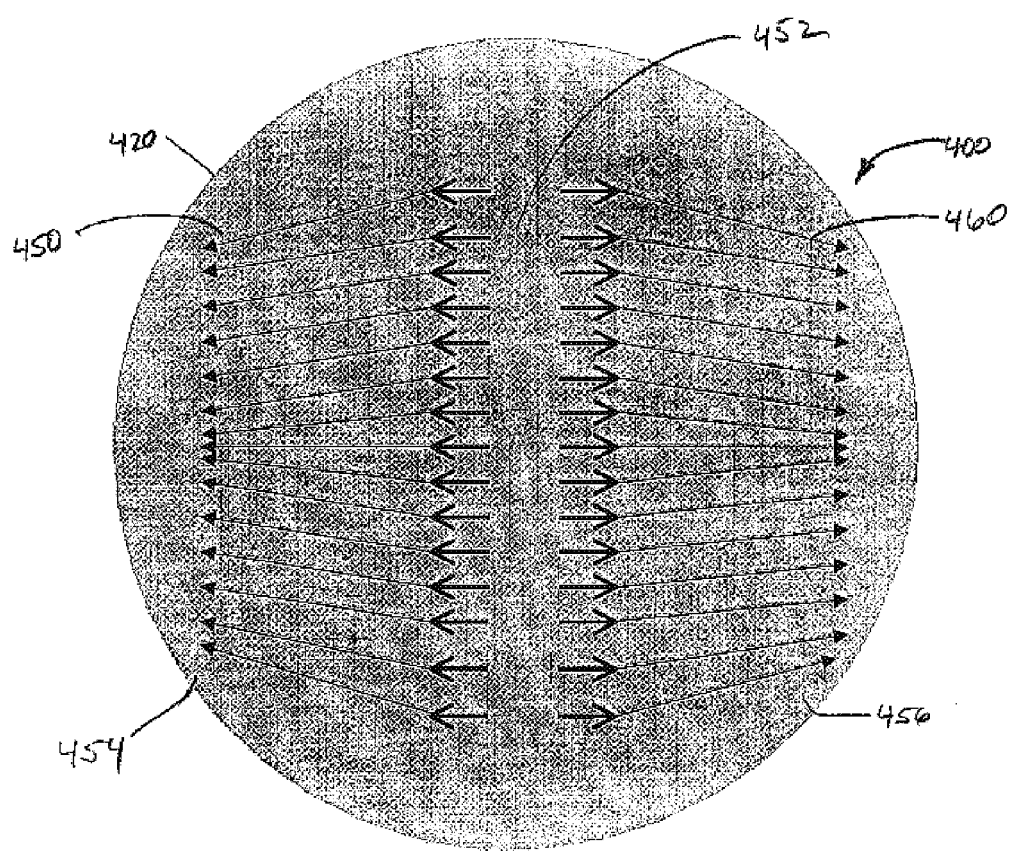
FIG. 4 illustrates a top plan view of a known permanent magnet similar to that illustrated in FIGS. 2 and 3 depicting magnetic flux paths.

FIGS. 2–4 illustrate one embodiment of a known permanent magnet system used in an MRI medical device similar to that illustrated in FIG. 1. Specifically, FIG. 2 illustrates a perspective view of a known permanent magnetic field generator system generally designated 200.

In the illustrated embodiment, permanent magnet system 200 comprises one or more components including opposing posts 210 (iron or steel posts for example), opposing yokes 220 (iron or steel yokes for example), opposing permanent magnetic blocks 230 (NdFeB for example) and opposing pole pieces 240. In this embodiment, one air gap 235 is illustrated between pole pieces 240 and permanent magnetic blocks 230. It should be appreciated that, why only this four components and one gap are illustrated, more or different components and gaps are contemplated. It is further contemplated that the components (i.e., the post, yokes, and pole pieces) may be made of the same or different material.

FIG. 3 illustrates a front elevational view of a known permanent magnet system similar to that illustrated in FIG. 2. FIG. 3 illustrates permanent magnet system 300 comprising opposing posts 310, opposing yokes 320, permanent magnetic blocks 330, air gap 235 and opposing pole pieces 340. FIG. 3 further depicts the magnetic flux paths or loops 350 and 360.

FIG. 4 illustrates a top plan view of a known permanent magnet system 400 similar to that illustrated in FIGS. 2 and 3. FIG. 4 illustrates yoke 420 and magnetic flux paths 450 and 460. In the illustrated embodiment, the magnetic flux is shown flowing outward from the center 454 of yoke 450 towards opposing ends 454 and 456. It should be appreciated that, in at least one embodiment, the magnetic flux would flow in the opposite direction on the opposing yoke as illustrated in FIG. 3.

For the purpose of understanding permanent magnets, the permanent magnet system is compared to an electrical circuit. The permanent magnetic blocks are equivalent to the power supply of the circuit, while the yokes, posts and the pole pieces are equivalent to electrical conductors having a small resistance. However, the air gap between the pole pieces or other places within magnetic flux loop, if any, have a large resistance. Therefore, it should be appreciated that the center magnetic field strength is equivalent to the voltage electric current flow across the large resistance air gap.

Thus for a fixed system (i.e., a system having fixed magnetic blocks), the center magnetic field is critically dependent on how the magnetic flux loop is created, and the air gap between the poles and within the loop, if any. Changing or modifying the air gaps, may change the center magnetic field.

It is contemplated that, in one embodiment, the magnetic flux flow may be adjusted or changed in the permanent magnet system by inserting, adding or removing adjustable steel plates (between the pole piece for example) to change or modify the air gaps in the magnetic loop. Changing or adjusting the air gaps in the magnetic loop increases or decreases the magnetic resistance in the selected (and more sensitive) region on the yoke, adjusting the center magnetic field.

Figure 5:
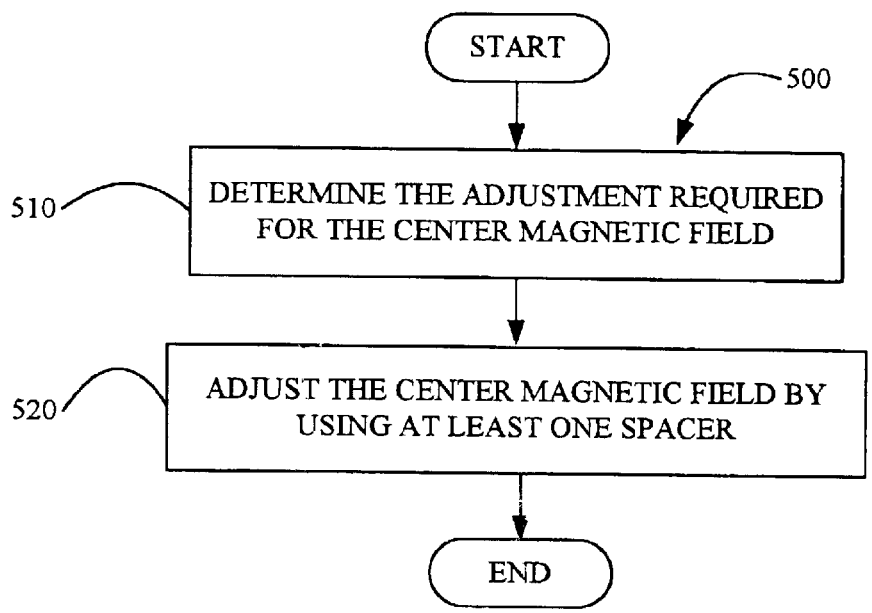
FIG. 5 illustrates a high level flow diagram depicting a method of adjusting a magnetic center field for a permanent MRI magnetic field generator (similar to that illustrated in FIG. 1) in accordance with certain embodiments of the present invention.

FIG. 5 illustrates a high level flow diagram depicting a method of adjusting a center magnetic field, generally designated 500, for a permanent MRI magnetic field generator (similar to that illustrated in FIG. 1) in accordance with certain embodiments of the present invention. In at least one embodiment, method 500 comprises Step 510, which comprising determining the adjustment required for the center magnetic field. Step 520 comprises adjusting the center magnetic field by adjusting, modifying, changing and/or using at least one spacer, where, in one embodiment, the spacer comprises at least one slot and/or insert.

Figure 6:
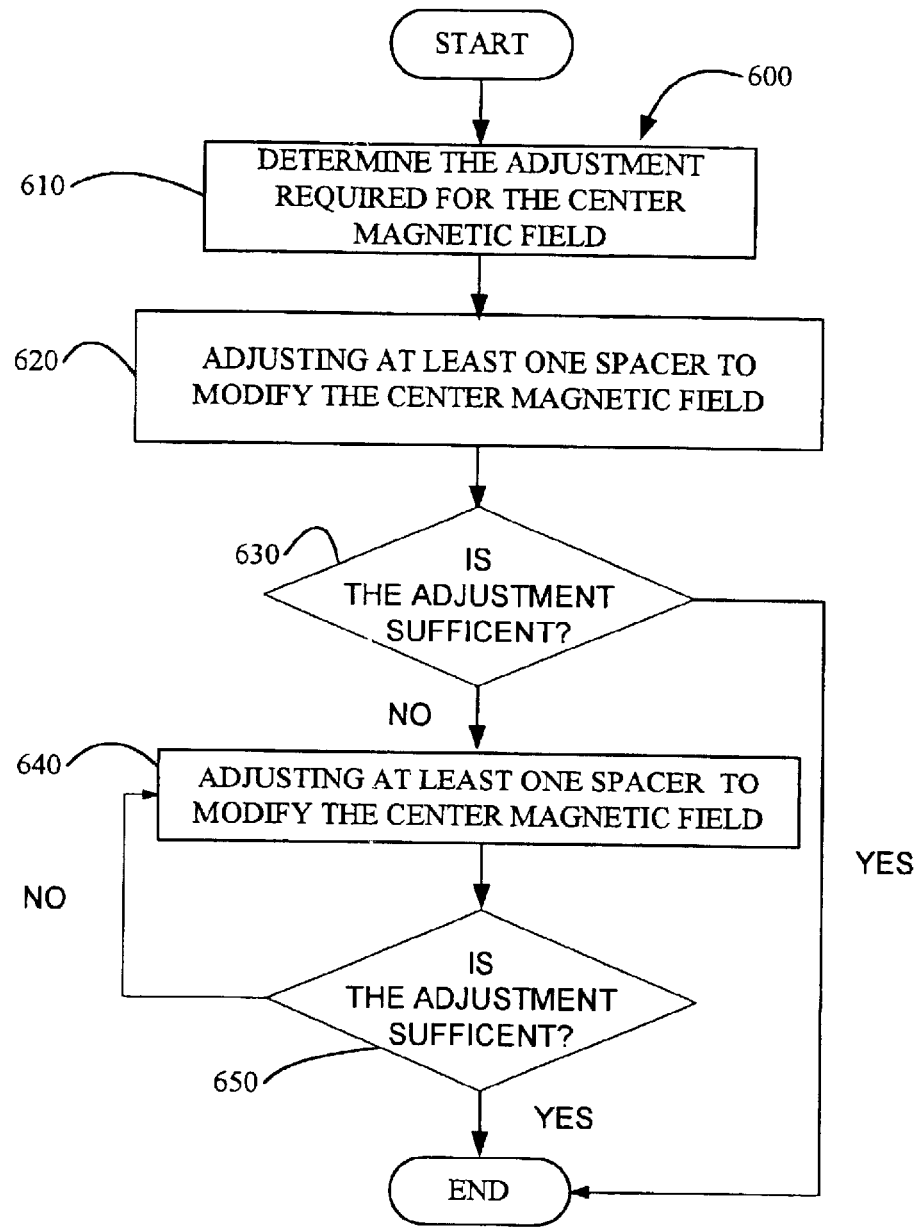
FIG. 6 illustrates a detailed flow diagram depicting a method of adjusting a magnetic center field for a permanent MRI magnetic field generator (similar to that illustrated in FIG. 1) in accordance with certain embodiments of the present invention.

FIG. 6 illustrates a detailed flow diagram depicting a method of adjusting a center magnetic field, generally designated 600, for a permanent MRI magnetic field generator (similar to that illustrated in FIG. 1) in accordance with certain embodiments of the present invention. In at least one embodiment, method 600 comprises Step 610, which comprises determining the adjustment required for the center magnetic fiend.

Step 620 comprises a first adjusting, modifying, changing and/or adding at least one spacer in the permanent magnetic to modify the magnetic center field. In at least one embodiment, adjusting, modifying, changing and/or adding at least one spacer comprises inserting or removing one or more insert plates from the one or more slots in the yoke or using insert plates of different metals having different magnetic properties as discussed below.

Method 600 further comprises Step 630, which comprises determining if the adjustment is sufficient (in a repetitious manner in one embodiment). If the adjustment is sufficient, method 600 ends. If the adjustment is not sufficient, method 600 comprises Step 640, which comprises a second adjusting, modifying, changing and/or adding at least one spacer in the permanent magnet field generator to modify the center magnetic field. In at least one embodiment, the same or different air gap may be adjusted, modified, changed and/or added as discussed below. Step 650 comprises determining if the adjustment is sufficient. If the adjustment is sufficient, method 600 ends. Otherwise the adjustment may continue (in a repetitive manner for example) until the adjustment is sufficient.

Figure 7:
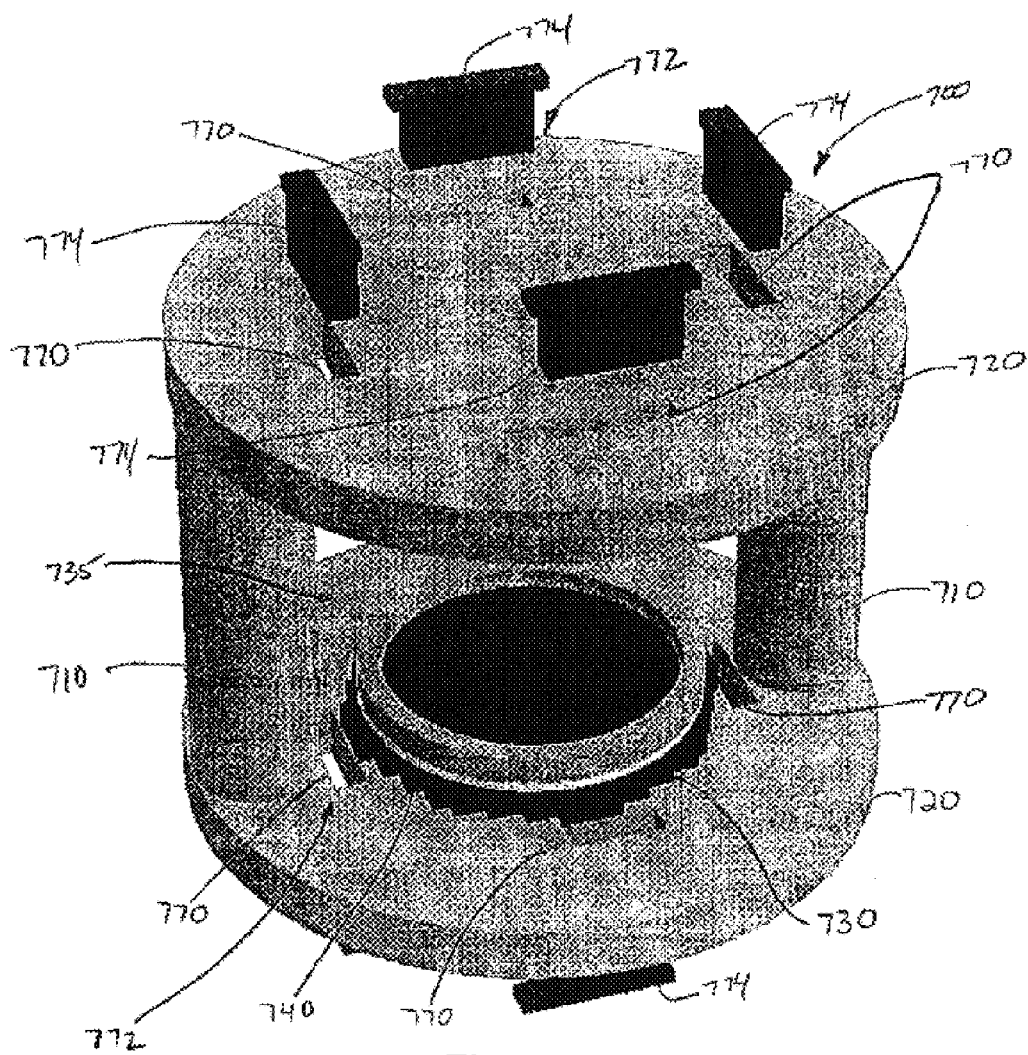
FIG. 7 illustrates a perspective view of a permanent magnet having spacers formed in the yoke in accordance with various embodiments of the present invention.

FIGS. 7 and 8 illustrate permanent magnets having slots in accordance with the present invention. In particular, FIG. 7 depicts a perspective view of a permanent magnet field generator system, generally designated 700, in accordance with various embodiments of the present invention. In the illustrated embodiment, permanent magnet field generator system 700 comprises opposing posts 710 (iron or steel posts for example), opposing yokes 720 (iron or steel yokes for example), opposing permanent magnetic blocks 730 (NdFeB for example), and opposing pole pieces 740.

In this embodiment, air gap 735 is illustrated between pole pieces 740.

In at least one embodiment of the present invention, yokes 720 are formed having at least one spacer 772 comprising at least one slot 770 formed or cut therein without affecting the integrity of the mechanical structure of the yokes. It should be appreciated that, while only one slot 770 is discussed, a plurality of slots are contemplated. For example, eight slots 770 (only seven slots are illustrated in FIG. 7) formed on opposing ends of opposing yokes 720. It is also contemplated that slots 770 may be formed in a symmetrical or un-symmetrical pattern on one end of one yoke, both ends of one yoke, one end of both yokes, or both ends of both yokes. It is further contemplated that one or more slots may be of different sizes and/or shapes.

In one embodiment, the spacers 772 further comprise at least one plate 774 associated with or inserted, at least whole or in part way, into at least one lot 770 in yoke 720. In one embodiment, one plate 774 is associated with only one slot 770 formed in only one end of one of the opposing yokes. However, in other embodiments, more than one plate 774 may be associated with more than one slot 770, where the plates 770 are the same or different size, same or different shapes or the same or different numbers. For example, there may be more plates 774 used with slots 770 on one yoke 770 than the other yoke, or the plates 774 on one yoke may be larger or different shape than the other yoke. Forming the spacers 772 (by removing one or more plates 774 for example) increases or affects the amount of air gaps by creating new air gaps or increasing the amount or area of the air gaps. Creating or increasing the amount of the air gaps intentionally modifies or changes one or more of the magnetic flux loops, thus changing or modifying the center magnetic field of the permanent magnet system.

FIGS. 3 and 4 illustrate the magnetic flux of a typical permanent magnet as provided previously. It should be appreciated that removing one or more plates or spacers from one or more yokes, changes or adds one or more air gaps, thus affecting or modifying the flux path or loops. The magnetic flux or loop mainly follows the path illustrated in FIG. 3, however, the major difference is the flux path on the steel yoke as illustrated in FIG. 8.

FIG. 8 illustrates the permanent magnet 800 having yoke 820 with four slots 870 formed therein. In this embodiment, slots 870 (with or without the plates) affect or modify fluxes 850 and 860 as shown. That is, in at least this embodiment, the flux path tend to flow around the slots 870. It should be appreciated that slots 870 may affect the center magnetic field (by as much as 76 Gauss for example) as illustrated by the change in flux between FIG. 2 and FIG. 8. In the illustrated embodiment, 2 cm by 5 cm steel plates were used to create the air gaps for example.

It is contemplated that modifying the structure, including widening the air gap and/or add more slots at selected locations on the yoke may change the field strength. It is also contemplated that using different material (different steel for example) having different magnetic properties, the adjustment capacity may also be modified. For example, C1020 steel may be used instead of C1006 steel or other metal.

In general, the magnetic field strength of an assembled MRI system is continuous. Providing for adjusting a magnetic field strength of an MRI system, enables the magnetic field to be fine turned as desired, since the spacers may be adjusted for partial insertion by design. Further using spacers of different material, short steel spacers for example, or using different materials, or the combination.

It is contemplated that, for magnet systems used for MRI, not only must the center field meet the specific field window, but the fields should have high field uniformity (i.e., or low harmonics). In at least one embodiment, spacers may be added in symmetrical fashion on the yokes. That is spacers may be added to both top and bottom, left and right, and/or front and back. The steel plates may also be installed intentionally in un-symmetrical fashion in order to reduce or eliminate certain harmonics. For an example, if it is determined that the magnetic field strength at bottom side of an MRI system is higher than at topside in the imaging volume, steel spacers may be added to the top yoke to adjust both the center field and harmonics. For example, in a magnet system with a 0.215 Tesla center field, if spacers added on the top yoke, the net effect on the center field and Z1 gradient across 40 cm diameter sphere are 55 Gauss and 3400 ppm. Further certain amount of field imbalance between the left and right side may be adjusted, as well as for the front and back side of the imaging volume.

One or more embodiments of the present invention provide for greater adjustability of the magnetic center field. The positions of the assembled permanent blocks may be accurately adjusted to the magnet center to meet the design specification.

At lease one embodiment may be adapted to suit different magnet systems. The adjustment capability of one or more embodiments may be adjusted for different systems with using one or more fashions, e.g., the spacer (i.e. slots and/or plate) size, spacer shape, spacer material, spacer quantity, and spacer location (i.e., in the middle, end, or both ends of one or all the yokes). It is also contemplated that magnetic center field distortion may be adjusted using a symmetrical pattern of spacers on only one end of one or both of the opposing yokes, or opposing ends of either one or both yokes. For example, it is contemplated that a symmetrical pattern of spacers may be formed in one end of one of the opposing yokes, both ends of one of the opposing yokes, the same ends of different opposing yokes, or different ends of different opposing yokes. It is further contemplated that same or different symmetrical patterns may be repeated at either ends or yokes, or that the symmetrical pattern may be different at different or yokes. It if further contemplated that all the spacers may be the same or different sizes, shapes and/or materials.

It is further contemplated that using spacers on the front, back and/or sides of the magnet systems may provide a certain level of field harmonic adjustability when used correctly. Further an intentionally un-symmetrical pattern of spacers (i.e., slots and/or plates) may be used to eliminate certain field harmonics. For example, it is contemplated that an un-symmetrical pattern of spacers may be formed in one end of one of the opposing yokes, both ends of one of the opposing yokes, the same ends of different opposing yokes, or different ends of different opposing yokes. It is further contemplated that same or different un-symmetrical pattern may be repeated at either ends or yokes, or that the un-symmetrical patterns may be different. It if further contemplated that all the spacers may be the same or different sizes, shapes and/or materials.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A magnetic field generator system having a magnetic center field, the generator comprising:
    opposing posts;
    opposing yokes connected to said opposing posts;
    at least one permanent magnetic block connected to at least one of said opposing yokes; and
    a slot formed in at least one of said yokes; and
    a plurality of plates to be inserted at least part way into said slot.

2. The system of claim 1 wherein said plurality of plates are individually inserted into said slot to achieve a desired magnetic center field.

3. The system of claim 2 wherein each plate in said plurality of plates is inserted vertically in said slot.

4. The system of claim 3 wherein each plate in said plurality of plates is installed adjacent another plate from said plurality of plates.

5. The system of claim 3 wherein a plate from said plurality of plates is not installed adjacent another plate from said plurality of plates.

6. The system of claim 2 wherein each plate in said plurality of plates is inserted horizontally in said slot.

7. The system of claim 6 wherein each plate in said plurality of plates is installed adjacent another plate from said plurality of plates.

8. The system of claim 6 wherein each plate in said plurality of plates is not installed adjacent another plate from said plurality of plates.

9. The system of claim 1 wherein at least two plates from said plurality of plates are of different sizes.

10. The system of claim 1 wherein at least one plate from said plurality of plates is a steel plate.

11. The system of claim 1 wherein at least two plates from said plurality of plates are comprised of different material.

12. A method for adjusting a magnetic center field of a permanent magnet system, said method comprising:
    determining an adjustment required for the magnetic center field; and
    adjusting the magnetic center field by installing a plurality of plates in a slot in a yoke of the permanent magnet system.

13. The method of claim 12 wherein installing said plurality of plates includes positioning the plates vertically in said slot.

14. The method of claim 13 wherein each plate from said plurality of plates is installed adjacent another plate from said plurality of plates.

15. The method of claim 13 wherein each plate in said plurality of plates is not installed adjacent another plate from said plurality of plates.

16. The method of claim 12 wherein each plate in said plurality of plates is inserted horizontally in said slot.

17. The method of claim 16 wherein each plate from said plurality of plates is installed adjacent another plate from said plurality of plates.

* * * * *